(12) United States Patent
Takeuchi et al.

(10) Patent No.: US 7,495,478 B2
(45) Date of Patent: Feb. 24, 2009

(54) COMPARATOR AND INFRARED REMOTE CONTROL RECEIVER

(75) Inventors: Noboru Takeuchi, Katsuragi (JP); Takahiro Inoue, Katsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/400,364

(22) Filed: Apr. 10, 2006

(65) Prior Publication Data

US 2006/0232900 A1 Oct. 19, 2006

(30) Foreign Application Priority Data

Apr. 14, 2005 (JP) .............................. 2005-117470

(51) Int. Cl.
*H03F 3/45* (2006.01)
(52) U.S. Cl. .............................. 327/51; 327/52; 327/77; 327/72
(58) Field of Classification Search .................. None
See application file for complete search history.

(56) References Cited

U.S. PATENT DOCUMENTS

| 4,210,830 | A | * | 7/1980 | Fukahori | 327/87 |
| 4,988,895 | A | * | 1/1991 | Kihara et al. | 327/73 |
| 5,162,671 | A | * | 11/1992 | Ishihara | 327/74 |
| 5,319,265 | A | * | 6/1994 | Lim | 327/73 |
| 5,369,319 | A | * | 11/1994 | Good et al. | 327/73 |
| 5,629,702 | A | * | 5/1997 | Koyasu et al. | 341/155 |
| 6,181,169 | B1 | * | 1/2001 | Hu | 327/77 |
| 7,227,792 | B2 | * | 6/2007 | Takahashi et al. | 365/189.09 |
| 2005/0200401 | A1 | * | 9/2005 | Jang | 327/538 |

FOREIGN PATENT DOCUMENTS

JP 01-132127 U 9/1989

* cited by examiner

*Primary Examiner*—Tuan T Lam
*Assistant Examiner*—Hiep Nguyen
(74) *Attorney, Agent, or Firm*—Birch, Stewart, Kolasch & Birch, LLP

(57) ABSTRACT

A comparator circuit of the present invention includes a comparator section and a current buffer circuit. In a normal mode, a standby current outputted from the comparator section is amplified by a predetermined times at the current buffer circuit. On the other hand, the standby current is not amplified in a standby mode.

10 Claims, 12 Drawing Sheets

VPNP Tr

LPNP Tr

NPN Tr

COMPARATOR AND INFRARED REMOTE CONTROL RECEIVER

This Nonprovisional application claims priority under 35 U.S.C. § 119(a) on Patent Application No. 117470/2005 filed in Japan on Apr. 14, 2005, the entire contents of which are hereby incorporated by reference.

FIELD OF THE INVENTION

The present invention relates to a comparator circuit and an infrared remote control receiver, which are built in, for example, an integrated circuit (IC). Such a comparator circuit is, for example, a hysteresis comparator circuit or other component, which is provided in (i) an infrared remote control receiver, (ii) a demodulator for a signal having a carrier wave, and (iii) the like.

BACKGROUND OF THE INVENTION

A hysteresis comparator circuit is commonly used in an output circuit section of an infrared remote control receiver or other component. The hysteresis comparator serves to prevent malfunctions of a circuit, such as chattering and the like.

In recent years, there has been a strong demand for energy savings. As to an infrared remote control receiver, there has been a need for reduction in power consumption during standby (during receiving no signal input). However, with a low bias current, it is difficult to drive a load. Thus, it is demanded to improve drive performance in an output circuit with a low current.

Further, in an IC used in an infrared remote control receiver or other component, which is provided in the vicinity of a photoelectric transfer element, light leak current occurs in a parasitic photo diode (hereinafter referred to as PD) due to noise light, becoming a cause of malfunctions. Such noise light includes diffracted light and scattering light of signal light, fluorescent light, incandescent light, and the like. This will be a problem specifically for a low current circuit, since effects of such leak current are significant in a low current circuit.

Further, there has also been a demand for a low cost, and such a circuit has been demanded that has a simple structure and a less chip size.

In the following, description is made as to a comparator circuit which maintains drive current capabilities in an output circuit even under the use of a low operation current, and which is small in size and less affected by the light leak current.

FIG. 14 illustrates a block diagram illustrating an infrared remote control receiver. The infrared remote control receiver includes an fo trimming circuit 101, a detector circuit 102, an integrator circuit 103, a hysteresis comparator 104 and the like. Generally, a photocurrent signal (input current signal) I_in, inputted from a photodiode (PD) chip, is demodulated and outputted by an integrated receiving chip. The output is connected to a microcomputer or the like, which controls an electronic device. The photocurrent signal I_in is an ASK signal modulated by a specific carrier wave approximately ranging from 30 kHz to 60 kHz. In the receiving chip, the received photocurrent signal is amplified by an amplifier, and carrier elements are extracted by a band pass filter (BPF) adjusted to a frequency of the carrier wave. Then, the carrier wave is detected by a detector circuit. Further, an integrator circuit integrates a time period during which the carrier wave is present and a hysteresis comparator determines the presence or absence of the carrier wave, so that digital output is carried out. FIG. 15 represents waveforms of the sections.

As a conventional example 1, FIG. 16 illustrates a circuitry of a hysteresis comparator described in a publicly known reference 1 (Japanese Utility Model Application No. 132127/1989 (Jitsukaihei 1-132127; published on: Sep. 7, 1989). The hysteresis comparator circuit includes a hysteresis voltage generating circuit 111, a current-to-voltage conversion resistor 112 (R1), an output stage circuit 113, and a comparator circuit 114. An input stage of the comparator circuit section includes differential pairs, in each of which an NPNTr and a PNPTr (QN1 and QP1, QN2 and QP2) have a darlington connection (hereinafter, Tr refers to a transistor). With the circuitry of the conventional example 1, such a hysteresis comparator circuit is provided that realizes high input impedance and prevents malfunctions of an output circuit.

FIG. 17 is a block diagram illustrating a comparator circuit of the conventional example 1.

The following describes operation of a conventional hysteresis comparator circuit.

(i) When Vin<Vth_H during standby, the differential pair QN2 and QP2 operate. Thus, an output current Iout1 of the comparator circuit 114 becomes 0, and the output stage circuit 113 does not operate. As a result, an output current Iout of the output stage circuit 113 is expressed by Iout=0. Thus, Vo=Hi.

In the hysteresis voltage generating circuit 111, the following equation (1) is satisfied.

$$Vth\_H = Vbe(D1) + I2 \cdot R3 + I1 \cdot (R2 + R3) \quad [1]$$

In this case, a current draw during standby is I1.

(ii) When Vin>Vth_H during receiving signal input (base currents of the transistors are ignored for simplicity), since the differential pair QN1 and QP1 operate, the following relationship is found.

$$Iout1 = I1$$

In the output stage circuit 113, QP5 turns on when R1·I1>Vbe. This allows the following relationship to be found, and finally gives the relationship expressed by equation (2).

$$Iout2 = Is \cdot \exp(R1 \cdot I1/Vt),$$

$$Iout = m \cdot Is \cdot \exp(R1 \cdot I1/Vt) \quad (2),$$

where Is is a saturation current of a transistor, Vt=kT/q, k is Voltzmann constant, Q is an elementary electric charge of an electron, T is an absolute temperature, m is a current ratio between a current mirrored current of QN5 and a current mirrored current of QN6. Thus, Vo=Lo.

In the hysteresis voltage generating circuit 111, the following equation (3) is satisfied.

$$Vth\_L = Vbe(D1) + I2 \cdot R3 \quad (3)$$

The hysteresis voltage is expressed by I1·(R2+R3), and the drive current is determined by the equation (2).

In the conventional example 1, the comparator circuit 114 has a current draw during standby expressed by I1, and a drive current expressed by the equation (2), allowing for trade-off between reduction in the current draw and drive current. That is, reduction in current draw causes reduction in drive current.

According to the equation (2), the drive current is increased by increasing m. However, since transistor(s) in an output stage are generally large, a chip size is increased, causing a cost increase.

Further, according to the equation (2), the drive current is increased by increasing R1. The following problems occur in this case.

In an IC provided in the vicinity of a photoelectric transfer element (e.g. an IC used in a remote control receiver), light leak current occurs in a parasitic photo diode due to noise light, becoming a cause of malfunctions in many cases. Such noise light includes diffracted light and scattering light of signal light, fluorescent light, incandescent light, and the like. FIG. 18 illustrates a structure of a L (lateral, horizontal type) PNPTr, and FIG. 19 illustrates an equivalent circuit of the LPNPTr. BS, EM, and CL denote a base, an emitter, and a collector, respectively. S1 is an area of an epitaxial layer of N type, and S2 is an area of the emitter. Due to structural features of an integrated circuit, a parasitic PD, i.e., PDa, exists between the epitaxial layer of N type and a substrate of P type. Thus, a parasitic PD is connected between a base terminal of the PNPTr and ground. Due to leak current occurred in the parasitic PD, a base current of the LPNPTr is increased, giving significant effects of characteristics of the circuit.

FIG. 20 illustrates a structure of an NPNTr, and FIG. 21 illustrates an equivalent circuit of the NPNTr. Similarly, a parasitic PD exists between an epitaxial layer of N type and a substrate of P type. Thus, a parasitic PD is connected between a collector terminal of the NPNTr and ground. This causes an increase in collector current of the NPNTr, giving significant effects of characteristics of the circuit.

In the conventional example 1, a light leak current occurred due to a parasitic PD is amplified to hfe(pnp) times by QP1. The parasitic PD varies depending on (i) collector diffusion of an NPNTr and (ii) base diffusion of a PNPTr, each of which is provided in an input section of a differential amplifier in a hysteresis comparator circuit. This allows the following relationship to be found.

$$Ileak = hfe(pnp) \cdot \{Ipd(npn) + Ipd(pnp)\} \quad (4),$$

where hfe(pnp) is a current amplification factor of a PNPTr, Ipd(npn) is a light leak current occurred due to collector diffusion of an NPNTr, and Ipd(pnp) is a light leak current occurred due to base diffusion of a PNPTr. Ileak causes a voltage drop in R1. When a relationship expressed by the following equation (5) is satisfied, QP5 turns on and the circuit malfunctions.

$$R1 \cdot hfe(pnp) \cdot \{Ipd(npn) + Ipd(pnp)\} > Vbe(QP5) \quad (5)$$

As clearly seen in the equation (5), increasing R1 increases the effects of the light leak current.

SUMMARY OF THE INVENTION

The present invention is made in view of the foregoing problems, and an object of the present invention is to realize a comparator circuit and an infrared remote control receiver, which are capable of (i) relaxing trade-off between reduction in current draw and drive performance, so as to effectively suppress degradation in the drive performance even when the current draw is reduced in the comparator circuit, (ii) suppressing increase in chip size and in cost, and (iii) suppressing effects of light leak current.

A comparator circuit of the present invention goes into either a normal mode or a standby mode based on a result of comparison of an input voltage and a threshold voltage, and which outputs an output current according to each of the modes, the comparator circuit including: a comparator section for comparing the input voltage and the threshold voltage, and for outputting a standby current in the standby mode, the standby current indicating a current flowing through the comparator circuit in the standby mode; and an amplifier circuit for amplifying and outputting, in the normal mode, the standby current outputted from the comparator section.

According to the arrangement, in the normal mode, the standby current outputted from the comparator section is amplified so as to be outputted. Therefore, in the standby mode, it is possible to reduce a current draw by setting the standby current to a sufficiently small value. On the other hand, in the normal mode, it is possible to suppress degradation in drive performance even when the standby current is made to be small, because the standby current is amplified so as to be outputted. In addition, increase in chip size and in cost is suppressed because it is not necessary to increase m of the equation (2), which expresses an output current in an output stage circuit. Further, effects of light leak current are suppressed because R1 of the equation (2) need not be increased.

This allows such effects to be achieved as (i) relaxing trade-off between reduction in current draw and drive performance in the comparator circuit and effectively suppressing degradation in drive performance even when a current draw in a comparator circuit is reduced, (ii) suppressing increase in chip size and in cost, and (iii) suppressing effects of light leak current.

Further, to attain the above object, an infrared remote control receiver of the present invention includes a comparator circuit which goes into either a normal mode or a standby mode based on a result of comparison of an input voltage and a threshold voltage, and which outputs an output current according to each of the modes, the comparator circuit including: a comparator section for comparing the input voltage and the threshold voltage, and for outputting a standby current in the standby mode, the standby current indicating a current flowing through the comparator circuit in the standby mode; and an amplifier circuit for amplifying and outputting, in the normal mode, the standby current outputted from the comparator section.

According to the arrangement, the infrared remote control receiver includes the comparator circuit of the present invention. Therefore, in the standby mode, it is possible to reduce a current draw by setting the standby current to a sufficiently small value. On the other hand, in the normal mode, it is possible to suppress degradation in drive performance even when the standby current is made to be small, because the standby current is amplified so as to be outputted. In addition, increase in chip size and in cost is suppressed because it is not necessary to increase m of the equation (2), which expresses an output current in an output stage circuit. Further, effects of light leak current are suppressed because R1 of the equation (2) need not be increased.

This gives an effect of realizing an infrared remote control receiver that is capable of (i) reducing a current draw during standby, (ii) increasing a drive current, and (iii) reducing effects of light leak current.

Additional objects, features, and strengths of the present invention will be made clear by the description below. Further, the advantages of the present invention will be evident from the following explanation in reference to the drawings.

DESCRIPTION OF THE EMBODIMENTS

Figure 14:
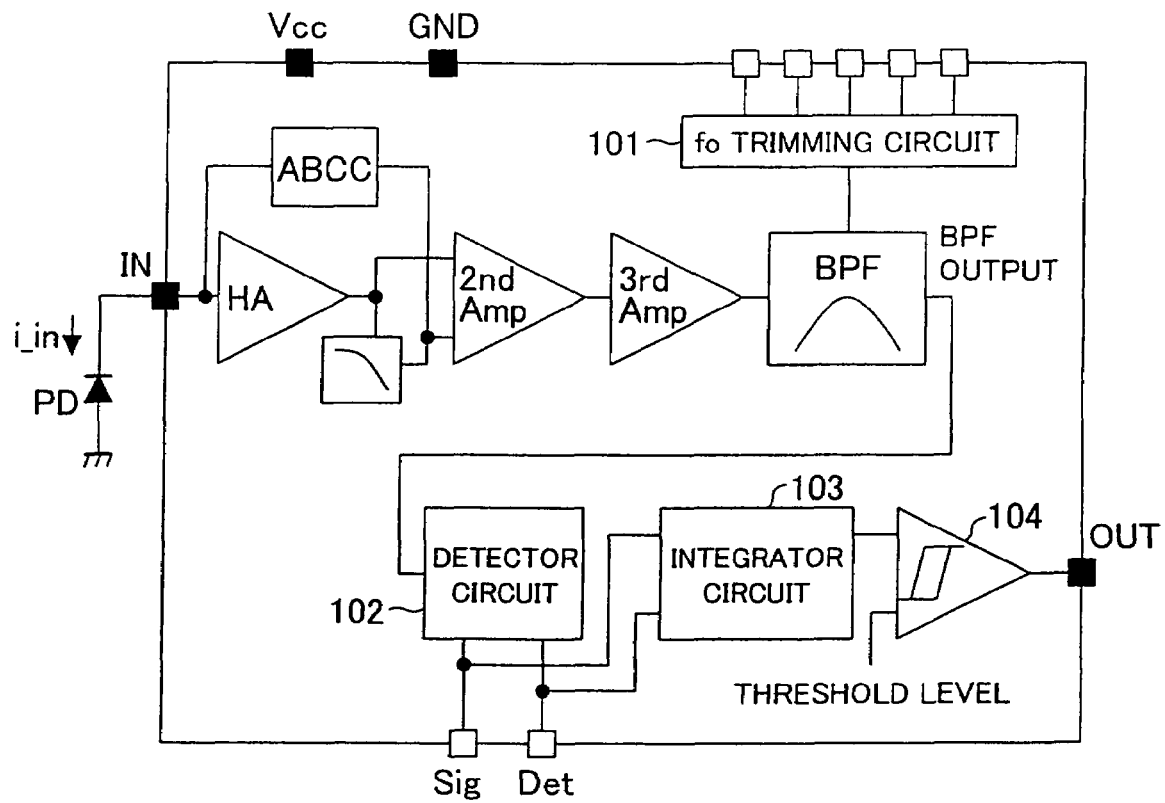
FIG. 14 is a block diagram illustrating an exemplary structure of a conventional infrared remote control receiver.
Figure 15:
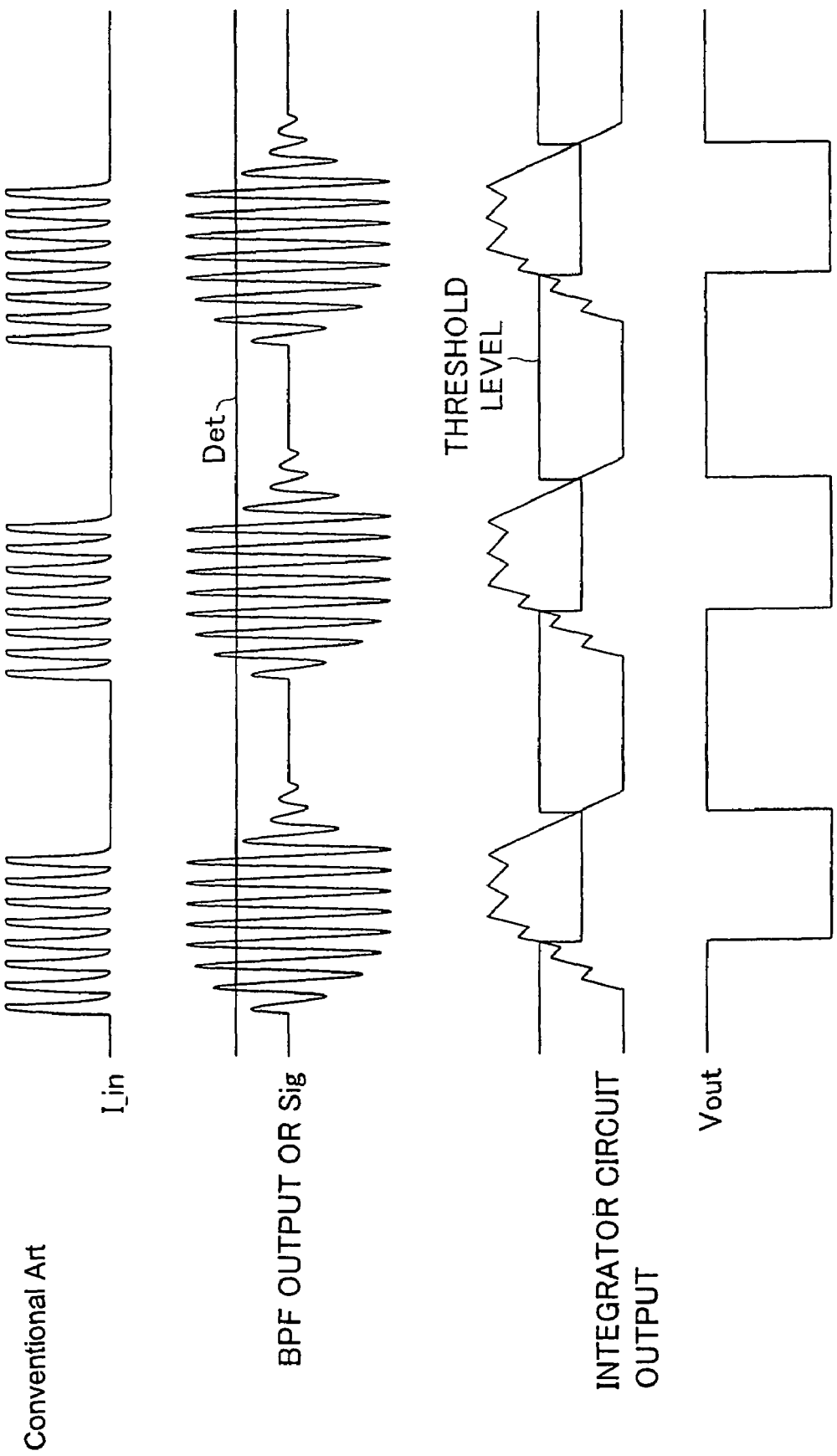
FIG. 15 is a view representing signal processing waveforms in a conventional receiving system.
Figure 16:
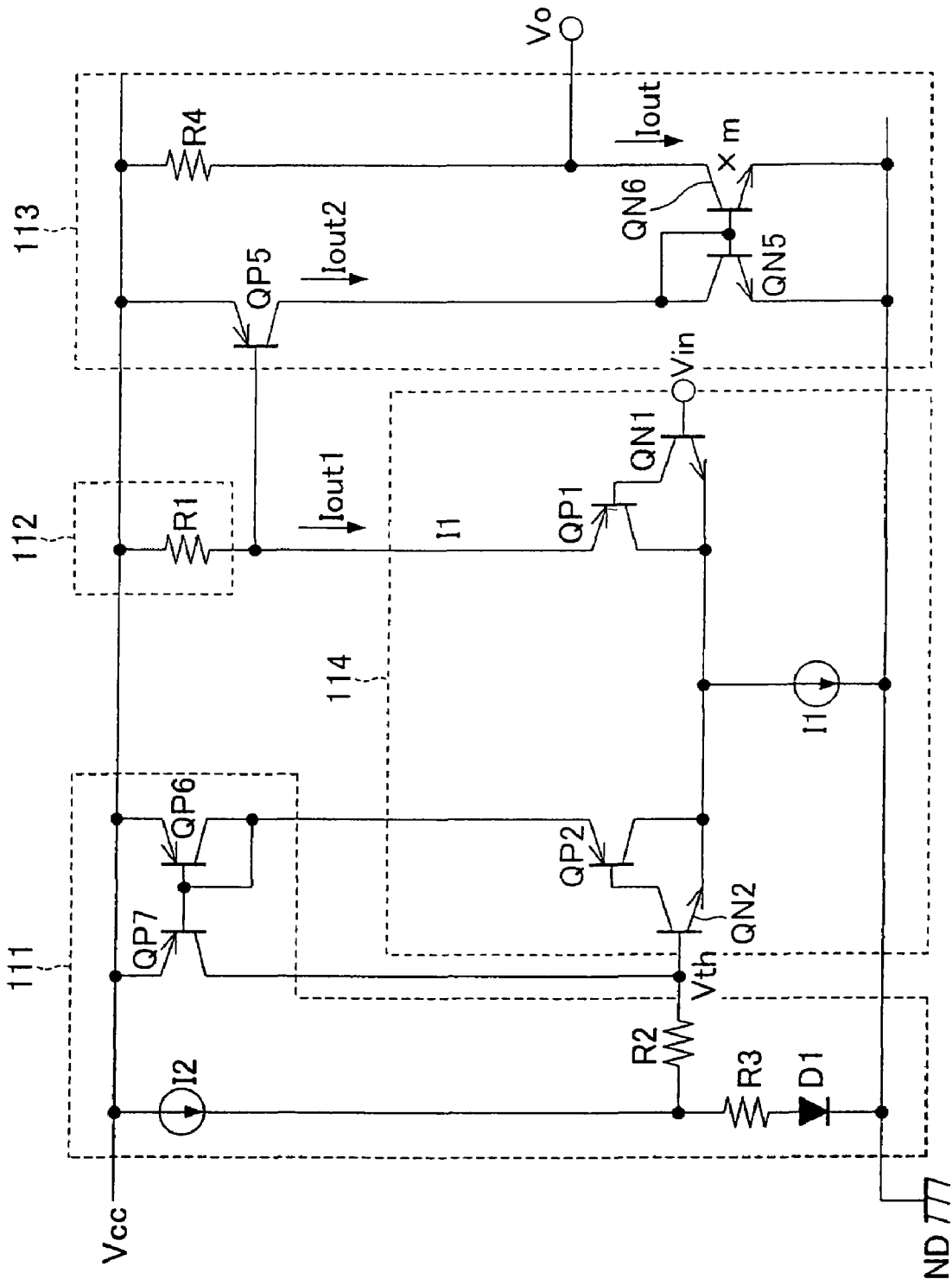
FIG. 16 is a circuit diagram illustrating an exemplary circuitry of a conventional hysteresis comparator.
Figure 17:
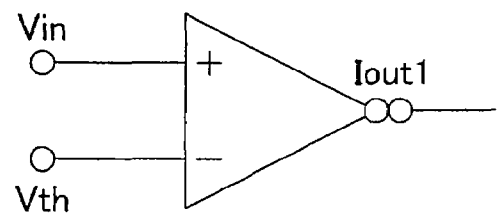
FIG. 17 is a block diagram illustrating an exemplary circuitry of a conventional hysteresis comparator.
Figure 18:
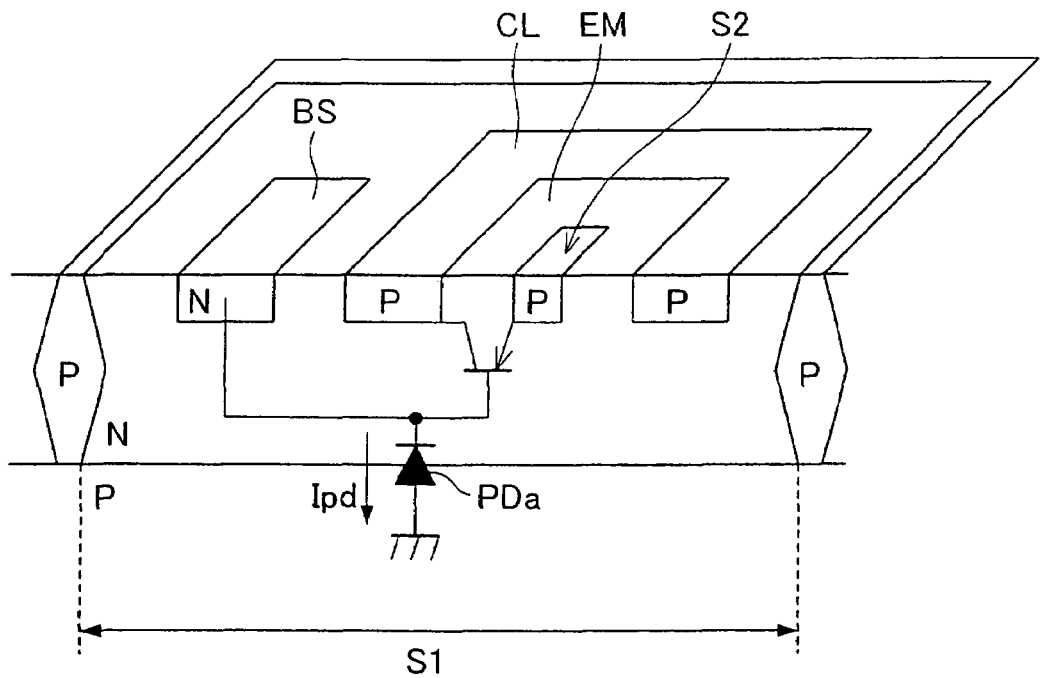
FIG. 18 is a perspective view illustrating a structure of a conventional LPNP transistor.
Figure 19:
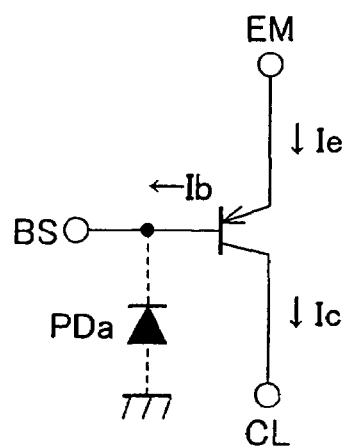
FIG. 19 is a circuit diagram illustrating an equivalent circuit of the conventional LPNP transistor.
Figure 20:
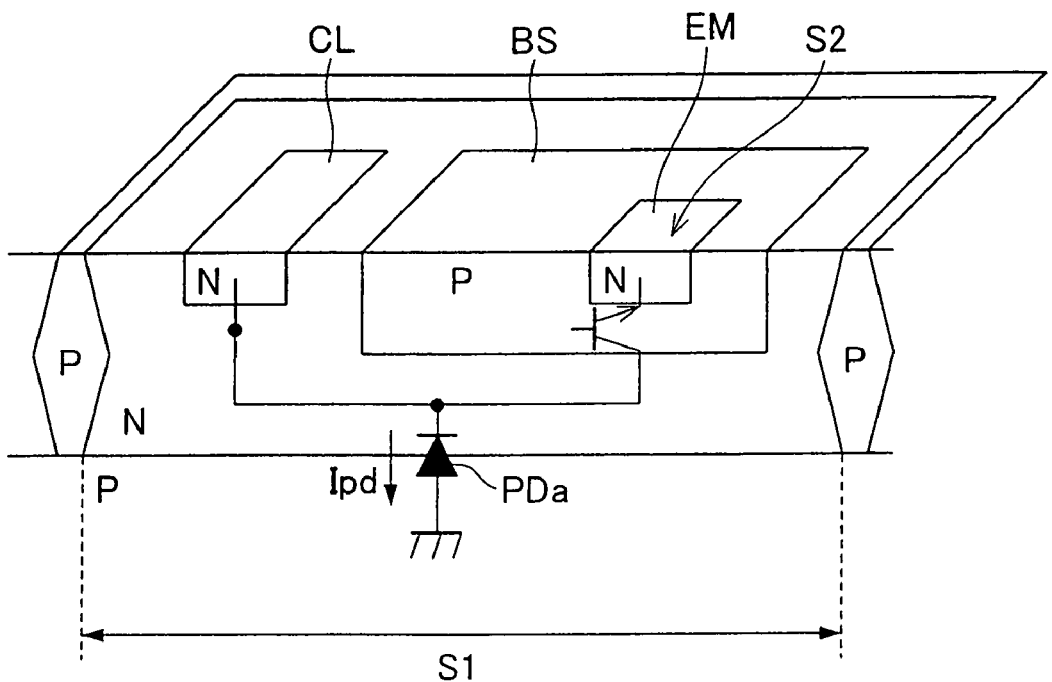
FIG. 20 is a perspective view illustrating a structure of a conventional NPN transistor.
Figure 21:
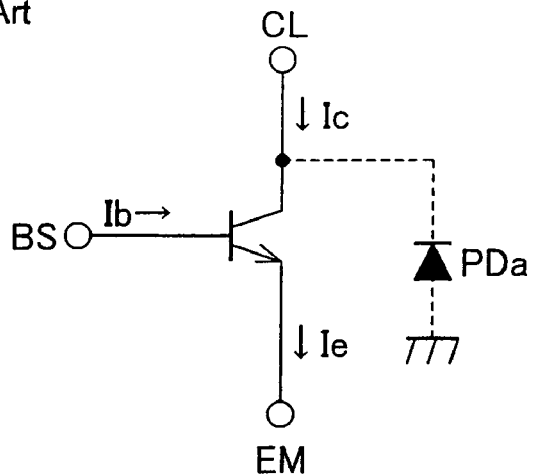
FIG. 21 is a circuit diagram illustrating an equivalent circuit of the conventional NPN transistor.

The following exemplifies a case where a comparator circuit of the present invention is applied in an infrared remote control receiver. However, the comparator circuit of the present invention can be applied also in various devices other than an infrared remote control receiver. The infrared remote control receiver has the structure illustrated in FIG. 14, in which a hysteresis comparator 104 is replaced with a hysteresis comparator circuit employing the comparator circuit of the present invention.

Figure 1:
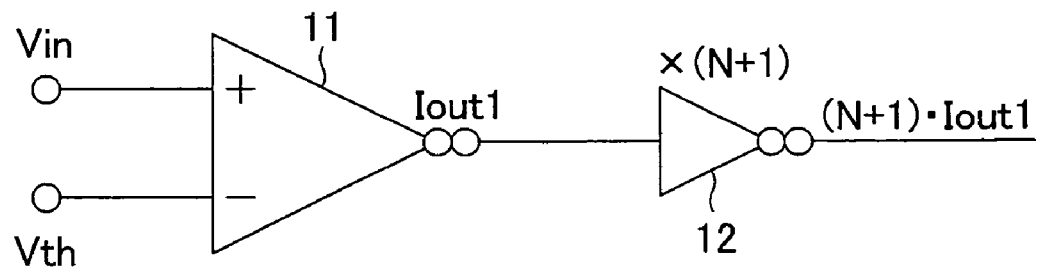
FIG. 1 is a block diagram illustrating an exemplary circuitry of a hysteresis comparator.

FIG. 1 is a block diagram illustrating a comparator circuit of the present embodiment. The comparator circuit has a current buffer circuit 12 (amplifier circuit) provided in a current output stage of a comparator section 11, and amplifies an output current Iout1 of the comparator section 11 by (N+1) times.

Figure 2:
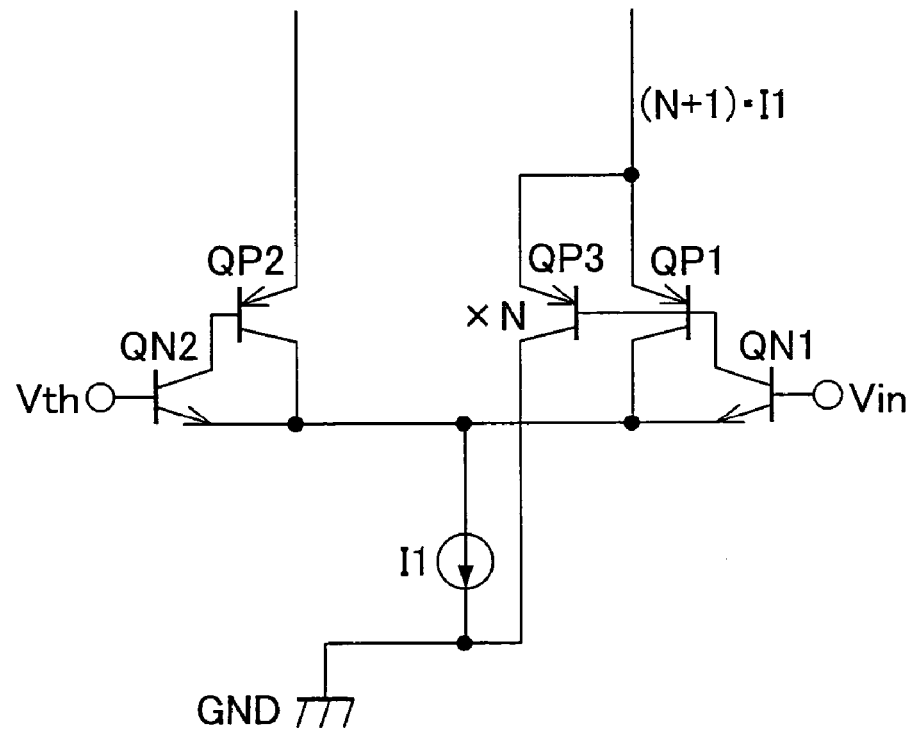
FIG. 2 is a circuit diagram illustrating an exemplary circuitry of the hysteresis comparator.
Figure 3:
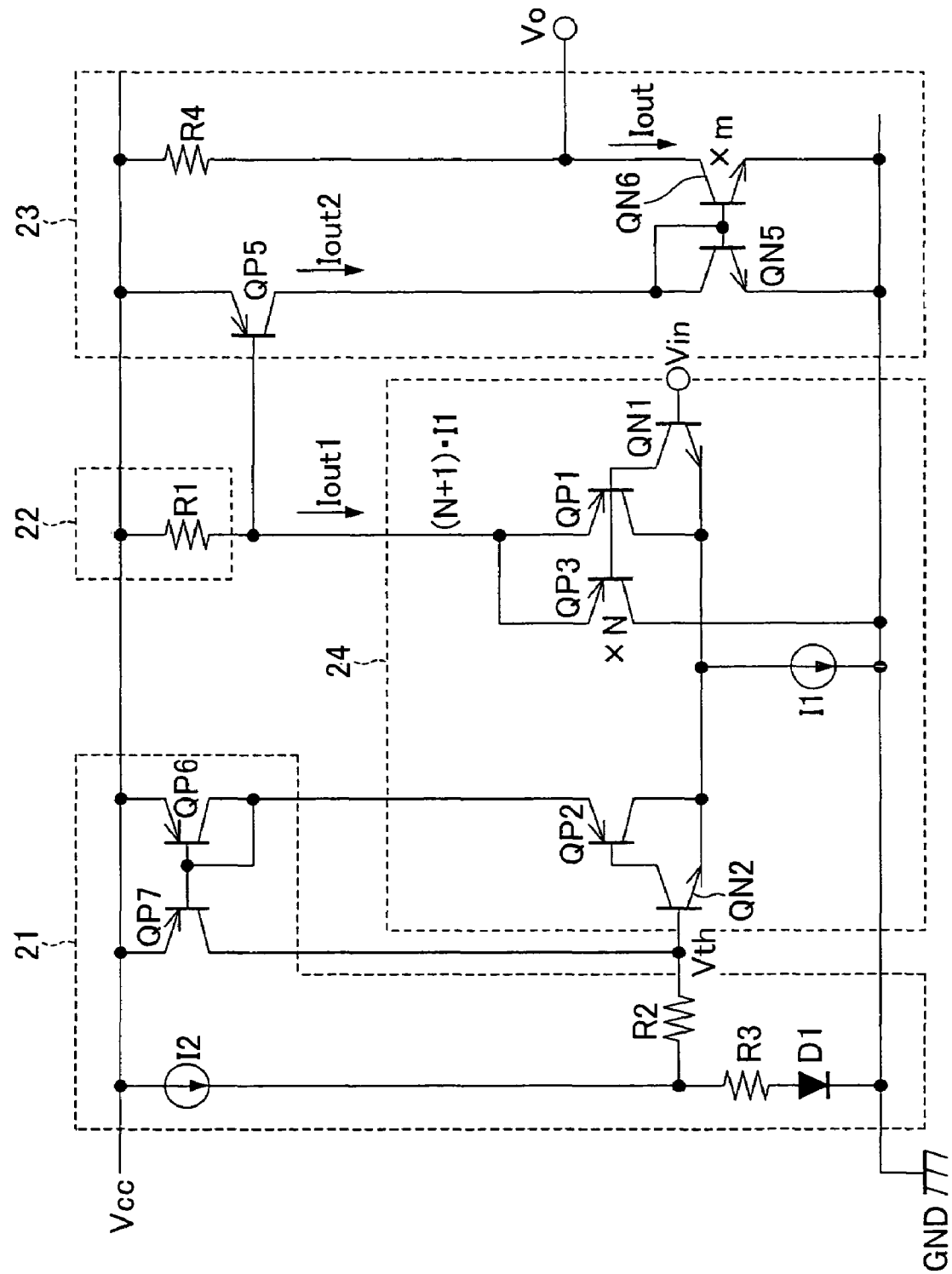
FIG. 3 is a circuit diagram illustrating an exemplary circuitry of a hysteresis comparator.
Figure 4:
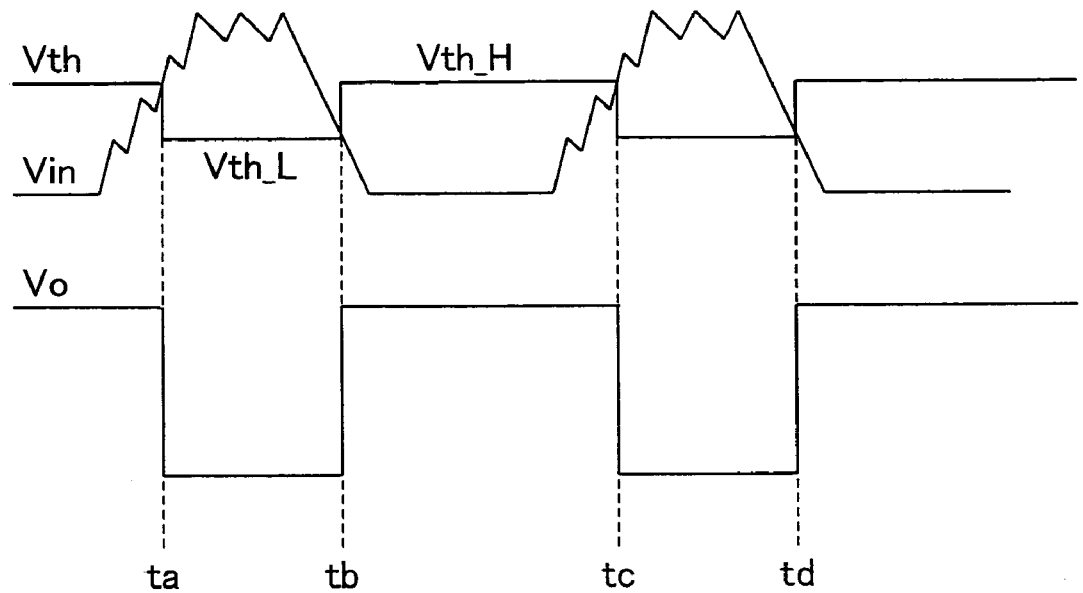
FIG. 4 is a view representing an operating waveform of a hysteresis comparator.

FIG. 2 is a circuit diagram specifically illustrating a the comparator circuit of the present embodiment. FIG. 3 illustrates a hysteresis comparator circuit employing the comparator circuit. The hysteresis comparator circuit includes a hysteresis voltage generating circuit 21, a current-to-voltage conversion resistor 22, an output stage circuit 23, and a comparator circuit 24. The hysteresis voltage generating circuit 21, the current-to-voltage conversion resistor 22, and the output stage circuit 23 are the same as those presented in the structure of the conventional example 1. The comparator circuit 24 has an identical structure with the circuit of the conventional example 1 except that a current buffer circuit (amplifier circuit) is provided. FIG. 4 represents an operating waveform of a hysteresis comparator circuit to which the present embodiment is applied.

In FIG. 4, Vth_H denotes a threshold value of the comparator while a voltage Vin increases, and Vth_L denotes a threshold value of the comparator while the voltage Vin decreases.

In the present embodiment, during receiving no signal input (standby mode), a current flowing through the circuit (standby current) is not amplified. On the other hand, during receiving signal input (normal mode), a standby current I1 is amplified.

The present embodiment exemplifies a case where a comparator circuit goes into the normal mode when the input voltage Vin is not less than the threshold voltage (Vth_H) (while Vin increases).

In a manner similar to the conventional example, according to the present embodiment, in a period during standby (during receiving no signal input), the following relationship is satisfied, Vin<Vth_H (when Vin increases) (up to time ta and time tc), or Vin<Vth_L (when Vin decreases) (after time tb and time td).

That is, the period during standby corresponds to periods during which the following relationship is found in FIG. 4.

Vin<Vth

On the other hand, in a period during receiving signal input, the following relationship is satisfied, Vin>Vth_H (when Vin increases) (after time ta and time tc), or Vin>Vth_L (when Vin decreases) (up to time tb and time td).

That is, the period during receiving signal input corresponds to periods during which the following relationship is found in FIG. 4.

Vin>Vth

In the hysteresis comparator circuit of the present embodiment, a voltage Vth during receiving signal input is a voltage Vth_L, and a voltage Vth during standby (receiving no signal input) is a voltage Vth_H.

An input stage of the comparator circuit 24 serves as a differential pair of a first NPNTr (QN1) and a first PNPTr (QP1), which have a darlignton connection with each other. Further, a third PNPTr (QP3) is connected to the first PNPTr (QP1) so as to constitute a current mirror circuit. With the above structure, a current buffer circuit (amplifier circuit) is realized.

The following describes operation of the hysteresis comparator circuit of the present embodiment.

(i) When Vin<Vth_H during standby, a differential pair QN2 and QP2 operate. This allows Iout1 to be 0, and the output stage circuit 23 does not operate. As a result, the following relationship is found, Iout=0.

Thus, Vo=Hi

In the hysteresis voltage generating circuit 21, the following equation (6) is satisfied, and a current draw during standby is I1.

$$Vth\_H = Vbe(D1) + I2 \cdot R3 + I1 \cdot (R2 + R3) \qquad [6]$$

(ii) When Vin>Vth_H during receiving signal input (base currents of the transistors are ignored for simplicity), since the differential pair of QN1 and QP1 operate, the following relationship is found.

$$Iout1 = I1.$$

Since QP1 and QP3 constitute a current mirror circuit, an output current of the comparator circuit 24 is amplified by (N+1) times, which is expressed as follows.

$$\text{An output current of the comparator circuit } 24 = (N+1) Iout1$$
$$= (N+1) I1,$$

where N denotes a ratio between a current mirrored current of QP1 and a current mirrored current of QP3.

In the output stage circuit 23, when $R1 \cdot (N+1) \cdot I1 > Vbe(QP5)$, QP5 turns on, allowing the following relationship to be found, $$Iout2 = Is \cdot \exp(R1 \cdot (N+1) \cdot I1/Vt).$$

This gives the relationship expressed by the following equation (7).

$$Iout = m \cdot Is \cdot \exp(R1 \cdot (N+1) \cdot I1/Vt) \qquad (7),$$

where Is is a saturation current of a transistor, $Vt = kT/q$, k is Voltzmann constant, q is an elementary electric charge of an electron, T is an absolute temperature, and m is a ratio between a current mirrored current of QN5 and a current mirrored current of QN6. Thus, Vo=Lo.

In the hysteresis voltage generating circuit 21, the following equation (8) is satisfied, and a hysteresis voltage is expressed by $I1 \cdot (R2+R3)$.

$$Vth\_L = Vbe(D1) + I2 \cdot R3 \qquad (8)$$

At this time, a drive current is determined by the equation (7).

According to the equation (7), in the circuitry of the present embodiment, it is possible to amplify the drive current by an amount expressed by the term (N+1). Specifically, due to the amount of the term (N+1) contained in the exponent (exp), the drive current is amplified by $\exp(R1 \cdot N \cdot I1/Vt)$ times. Further, since QP3 operates only during receiving signal input, a current draw during standby is I1. Thus, when the drive current is constant, it is possible to reduce the current draw during standby to I1/(N+1). That is, by changing the standby current (constant current I1) from I1 to I1/(N+1) (i.e., by reducing the standby current), the equation (7) is expressed as follows.

$$Iout = m \cdot Is \cdot \exp\{R1 \cdot (N+1) \cdot I1/(N+1)/Vt\}$$
$$= m \cdot Is \cdot \exp(R1 \cdot I1/Vt)$$

As a result, the equation becomes equal to the equation (2), so that it becomes possible to supply a drive current equal to that of the conventional example. This allows a reduction in the current draw during standby, while maintaining the drive current equal to that of the conventional example (Iout is constant).

At this time, light leak currents occur at a collector of QN1 and bases of QP1 and QP3, and the following equation (9) is established.

$$Ileak = hfe(pnp) \cdot \{Ipd(npn) + (N+1) \cdot Ipd(pnp)\} \qquad (9),$$

where hfe(pnp) is a current amplification factor of a PNPTr, Ipd(npn) is a light leak current occurred due to collector diffusion of an NPNTr, and Ipd(pnp) is a light leak current occurred due to base diffusion of a PNP transistor. Ileak causes a voltage drop of $R1 \cdot Ileak$ in R1. That is, the following relationship is found.

$$R1 \cdot Ileak = R1 \cdot hfe(pnp) \cdot \{Ipd(npn) + (N+1) \cdot Ipd(pnp)\}$$

When the voltage drop exceeds a voltage Vbe(QP5) i.e., when $R1 \cdot Ileak > Vbe(QP5)$, QP5 turns on and the circuit malfunctions. In other words, the following equation (10) is satisfied in this case.

$$R1 \cdot hfe(pnp) \cdot \{Ipd(npn) + (N+1) \cdot Ipd(pnp)\} > Vbe(QP5) \qquad (10)$$

Thus, when the constant current I1 remains I1 and the resistance R1 is set to R1/(N+1) (i.e., when the resistance is reduced), the equation (7) is expressed as follows.

$$Iout = m \cdot Is \cdot \exp\{R1/(N+1) \cdot (N+1) \cdot I1/Vt\}$$
$$= m \cdot Is \cdot \exp(R1 \cdot I1/Vt)$$

This allows the drive current to be equal to that of the conventional example (equation (2)).

When the resistance R1 is reduced to R1/(N+1), the voltage drop, occurred in the resistor due to the light leak current, is found as follows by replacing R1 with R1/(N+1) in the equation expressing $R1 \cdot Ileak$.

$$R1/(N+1) \cdot Ileak = R1 \cdot hfe(pnp) \cdot \{Ipd(npn)/(N+1) + Ipd(pnp)\}$$

Compared to the equation (5), which expresses a voltage drop occurred in the resistor due to light leak current in the conventional case (leak current is Ileak0), the following relationship is found.

$$R1 \cdot Ileak0 - R1/(N+1) \cdot Ileak = R1 \cdot hfe(pnp) \cdot Ipd(npn) \cdot N/(N+1)$$

This explains that the voltage drop is reduced by an amount expressed by the above equation. Therefore, when the light leak currents Ipd(npn) and Ipd(pnp) occur due to disturbance light having a certain brightness, it becomes harder, compared to the conventional example, to reach a voltage allowing QP5 to turn on and to start malfunctioning. This reduces the effects of the light leak current.

In an actual circuit design, I1, Iout, and R1 are set to arbitrary values considering effects of (i) current draw during standby, (ii) drive current, and (iii) light leak current.

Figure 5:
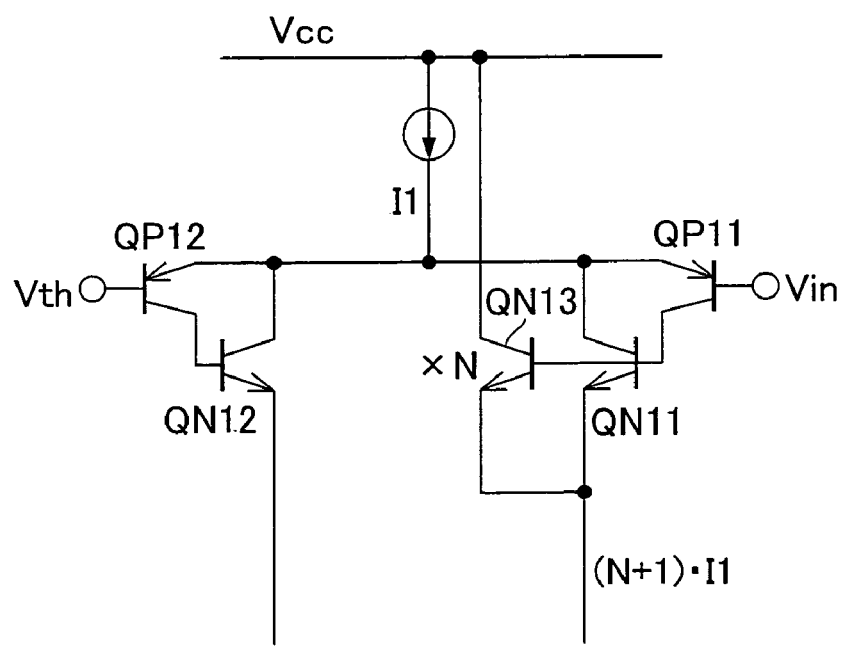
FIG. 5 is a circuit diagram illustrating an exemplary circuitry of a hysteresis comparator.
Figure 6:
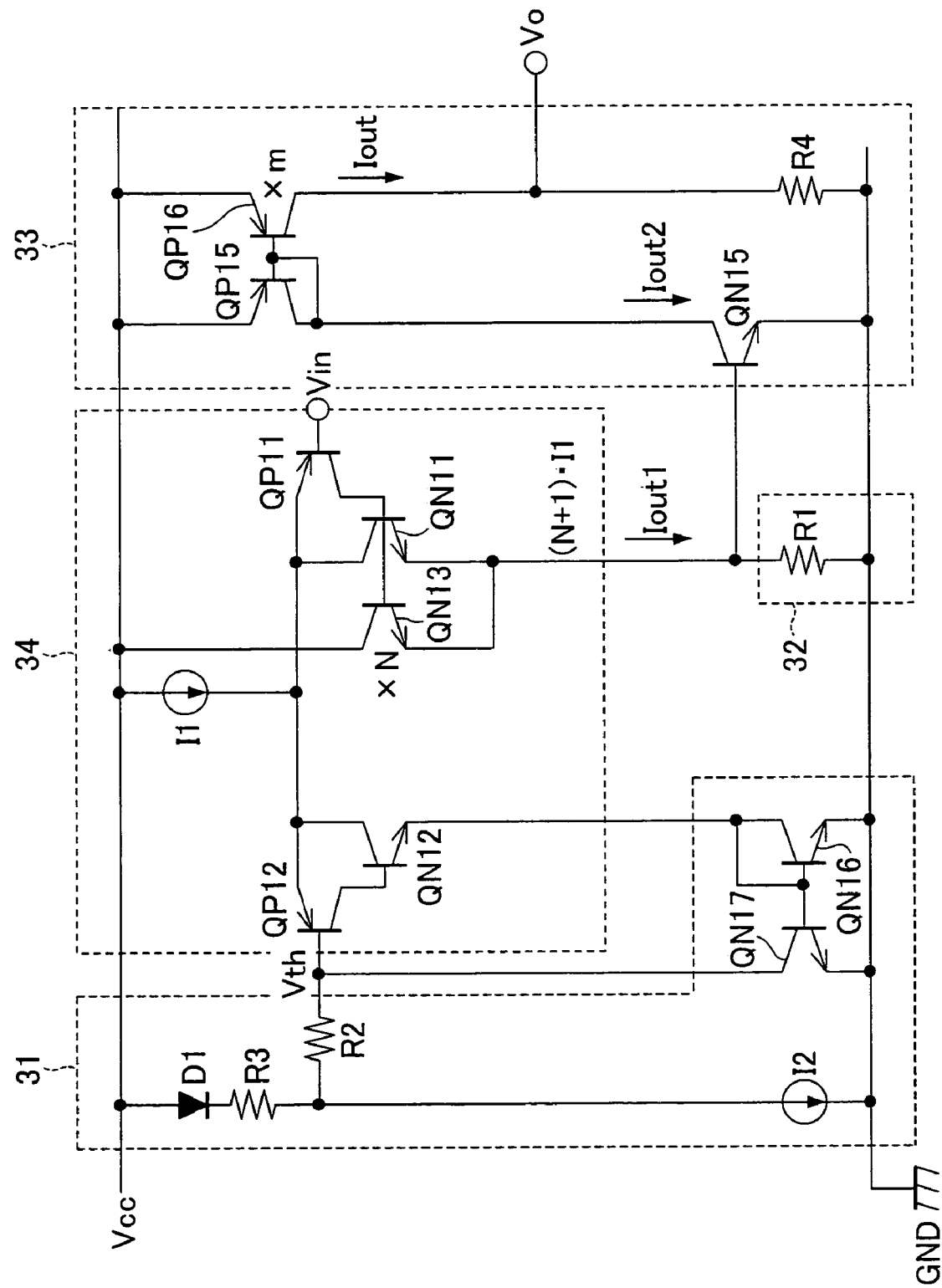
FIG. 6 is a circuit diagram illustrating an exemplary circuitry of a hysteresis comparator.
Figure 7:
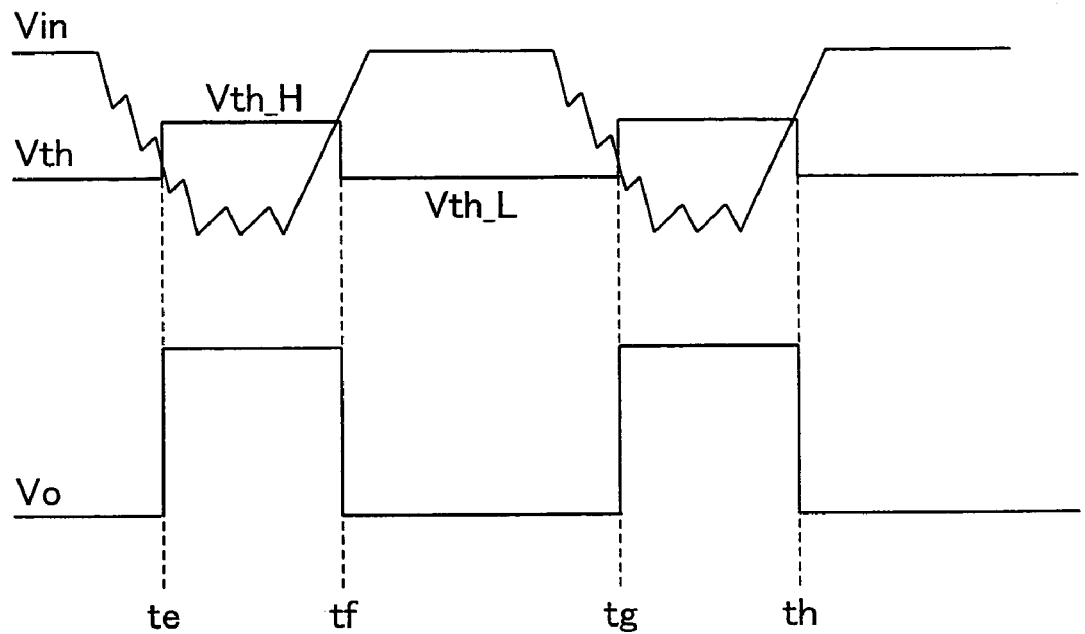
FIG. 7 is a view representing an operating waveform of a hysteresis comparator.

The following describes another exemplary circuitry. FIG. 5 is a specific circuit diagram illustrating a comparator circuit of the present embodiment. FIG. 6 illustrates a hysteresis comparator circuit employing the comparator circuit. The hysteresis comparator circuit includes a hysteresis voltage generating circuit 31, a current-to-voltage conversion resistor 32, an output stage circuit 33, and a comparator circuit 34. FIG. 7 represents an operating waveform of a hysteresis comparator circuit to which the present embodiment is applied.

The present embodiment shows a case where a comparator circuit goes into a normal mode when an input voltage Vin is not more than a threshold voltage (Vth_L) (while Vin decreases).

In the present embodiment, contrary to the circuitry illustrated in FIG. 2, in a period during standby (during receiving no signal input), the following relationship is satisfied, Vin>Vth_L (when Vin decreases) (up to time te and time tg), or Vin>Vth_H (when Vin increases) (after time tf and time th).

That is, the period during standby corresponds to periods during which the following relationship is found in FIG. 7.

Vin>Vth

On the other hand, in a period during receiving signal input, the following relationship is satisfied, Vin<Vth_L (when Vin decreases) (after time te and time tg), or Vin<Vth_H (when Vin increases) (up to time tf and time th).

That is, the period during receiving signal input corresponds to periods during which the following relationship is found in FIG. 7.

Vin<Vth

In the hysteresis comparator circuit of the present embodiment, a voltage Vth during receiving signal input is a voltage Vth_H, and a voltage Vth during standby (receiving no signal input) is a voltage Vth_L.

An input stage of the comparator circuit 34 serves as a differential pair of a PNPTr and an NPNTr, which have a darlignton connection with each other. Further, a third NPNTr is connected to the first NPNTr so as to constitute a current mirror circuit. With the above structure, a current buffer circuit (amplifier circuit) is realized.

The structure of FIG. 6 and the structure of FIG. 2 are symmetrical in a vertical direction.

The following describes operation of the hysteresis comparator circuit of the present embodiment.

(i) When Vin>Vth$_{13}$H during standby, a differential pair QP12 and QN12 operate. This allows Iout1 to be 0, and the output stage circuit 33 does not operate. As a result, the following relationship is found, Iout=0. Thus, Vo=Lo.

In the hysteresis voltage generating circuit 31, the following equation (11) is satisfied, and a current draw during standby is I1.

$$Vth\_L=Vcc-\{Vbe(D1)+I2\cdot R3+I1\cdot(R2+R3)\} \quad [11]$$

(ii) When Vin<Vth_H during receiving signal input (base currents of the transistors are ignored for simplicity), since a differential pair of QP11 and QN11, and QN13 operates, the following relationship is found.

Iout1=I1

Since QN11 and QN13 constitute a current mirror circuit, an output current of the comparator circuit is amplified by (N+1) times, which is expressed as follows.

An output current of the comparator circuit 34 = (N + 1)Iout1

= (N + 1)I1, where N denotes a ratio between a current mirrored current of QN11 and a current mirrored current of QN13.

In the output stage circuit 33, when R1·(N+1)·I1>Vbe (QN15), QN15 turns on, allowing the following relationship to be found.

Iout2=Is·exp{R1·(N+1)·I1/Vt}

This gives the relationship expressed by the following equation (12).

$$Iout=m\cdot Is\cdot\exp\{R1(N+1)\cdot I1/Vt\} \quad (12),$$

where Is is a saturation current of a transistor, Vt=kT/q, k is Voltzmann constant, q is an elementary electric charge of an electron, T is an absolute temperature, and m is a ratio between a current mirrored current of QP15 and a current-mirrored current of QP16. Thus, Vo=Hi.

In the hysteresis voltage generating circuit 31, the following equation (13) is satisfied, and a hysteresis voltage is expressed by I1·(R2+R3).

$$Vth\_H=Vcc-\{Vbe(D1)+I2\cdot R3\} \quad (13)$$

At this time, a drive current is determined by the equation (12).

According to the equation (12), in the circuitry of the present embodiment, it is possible to amplify the drive current by an amount expressed by the term (N+1). Specifically, due to the amount of the term (N+1) contained in the exponent (exp), the drive current is amplified by exp(R1·N·I1/Vt) times. Further, since QN13 operates only during receiving signal input, a current draw during standby is I1. Thus, when the drive current is constant, it is possible to reduce the current draw during standby to I1/(N+1). That is, by changing the standby current (constant current I1) from I1 to I1/(N+1) (i.e., by reducing the standby current), the equation (12) is expressed as follows.

$$Iout = m\cdot Is\cdot\exp\{R1\cdot(N+1)\cdot I1/(N+1)/Vt\}$$

$$= m\cdot Is\cdot\exp(R1\cdot I1/Vt)$$

As a result, the equation becomes equal to the equation (2), and it becomes possible to supply a drive current equal to that of the conventional case. This allows a reduction in the current draw during standby, while maintaining the drive current equal to that of the conventional case (Iout is constant).

At this time, a light leak current occurs at a base of QP11 and is multiplied by hfe(npn)·hfe(pnp) times. Light leak currents occurred at collectors of QN11 and QN13 do not affect R1. That is, the following equation (14) is established.

$$Ileak=hfe(npn)\cdot hfe(pnp)\cdot Ipd(pnp)\} \quad (14),$$

where hfe(npn) is a current amplification factor of an NPNTr, hfe(pnp) is a current amplification factor of a PNPTr, and Ipd(pnp) is a light leak current occurred due to base diffusion of an PNPTr. Ileak causes a voltage drop of R1·Ileak in R1. That is, the following relationship is found.

R1·Ileak=R1·hfe(npn)·{Ipd(pnp)·Ipd(pnp)}

When the voltage drop exceeds a voltage Vbe (QP5) i.e., when R1·Ileak>Vbe(QP5), QP5 turns on and the circuit malfunctions. In other words, the following equation (15) is satisfied in this case.

$$R1\cdot hfe(npn)\cdot hfe(pnp)\cdot\{Ipd(pnp)>Vbe(QP5) \quad (15)$$

Thus, when the constant current I1 remains I1 and the resistance R1 is set to R1/(N+1) (i.e., when the resistance is reduced), the equation (12) is expressed as follows.

$$Iout = m\cdot Is\cdot\exp\{R1/(N+1)\cdot(N+1)\cdot I1/Vt\}$$

$$= m\cdot Is\cdot\exp(R1\cdot I1/Vt)$$

This allows the drive current to be equal to that of the conventional example (equation (2)).

When the resistance R1 is reduced to R1/(N+1), the voltage drop, occurred in the resistor due to the light leak current, is found as follows by replacing R1 with R1/(N+1) in the equation expressing R1·Ileak.

$$R1/(N+1) \cdot Ileak = R1 \cdot hfe(npn) \cdot hfe(pnp) \cdot Ipd(pnp)/(N+1)$$

Compared to the voltage drop occurred in the resistor due to the leak current in the conventional example, the following relationship is found.

$$R1 \cdot Ileak - R1/(N+1) \cdot Ileak = R1 \cdot Ileak \cdot N/(N+1)$$
$$= R1 \cdot hfe(pnp) \cdot Ipd(npn) \cdot N/(N+1)$$

This explains that the voltage drop is reduced by an amount expressed by the above equation. Therefore, when the light leak currents Ipd(npn) and Ipd(pnp) occur due to disturbance light having a certain brightness, it becomes harder, compared to the conventional case, to reach a voltage allowing QP5 to turn on and to start malfunctioning. This reduces the effects of the light leak current.

Figure 8:
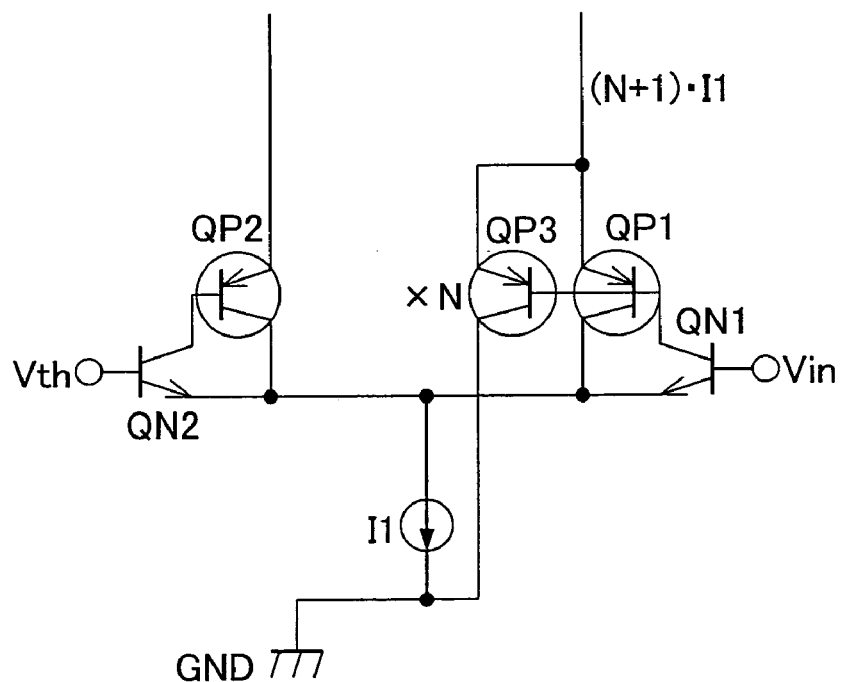
FIG. 8 is a circuit diagram illustrating an exemplary circuitry of a hysteresis comparator.

The following describes another exemplary circuitry. FIG. 8 illustrates a comparator circuit of the present embodiment, which has a vertical PNP structure (hereinafter referred to as VPNP) of QP1, QP2, and QP3 in the circuitry of FIG. 2. The circuit of FIG. 8 operates in a manner similar to the circuit of FIG. 2.

In the following, description is made as to effects of light leak current.

Figure 9:
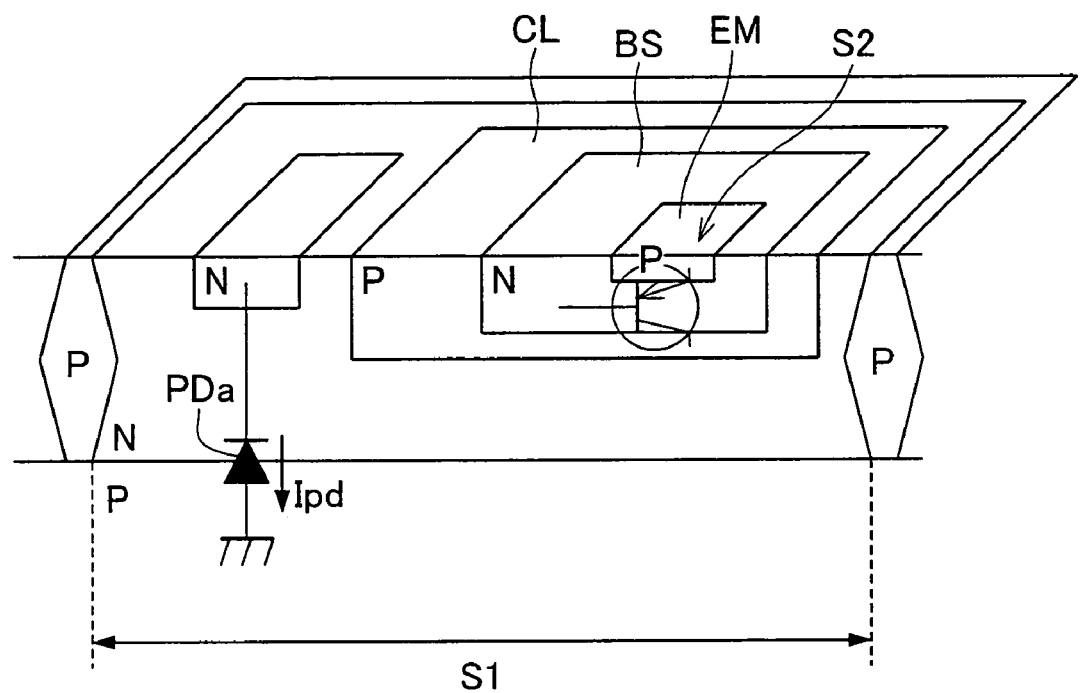
FIG. 9 is a perspective view illustrating a structure of a VPNP transistor.
Figure 10:
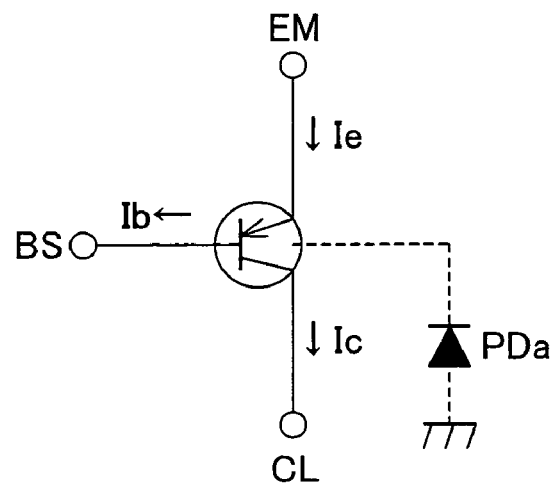
FIG. 10 is a circuit diagram illustrating an equivalent circuit of the VPNP transistor.

FIG. 9 illustrates a structure of a VPNPTr, and FIG. 10 illustrates an equivalent circuit of the VPNPTr. In FIGS. 9 and 10, BS, EM, and CL denote a base, an emitter, and a collector, respectively ("BS", "EM", and "CL" hereinafter). S1 is an area of an epitaxial layer of N type, and S2 is an area of the emitter. A parasitic PD, i.e., PDa, exists between the epitaxial layer of N type and a substrate layer of P type. However, in the VPNPTr, the epitaxial layer of N type only gives a potential (commonly referred to as Vcc), and light leak current does not affect operation of the transistor. A parasitic PD exists also between base diffusion (N) and collector diffusion (P). However, since an area of the base diffusion is small, the parasitic PD affects less than the capacitor present in the LPNPTr. Thus, in the circuitry of the present embodiment, a light leak current is found by the following equation (16).

$$Ileak = hfe(pnp) \cdot Ipd(npn) \quad (16),$$

where hfe(pnp) is a current amplification factor of a PNPTr and Ipd(npn) is a light leak current occurred due to NPNTr collector diffusion. This reduces occurrence of light leak current, thereby reducing malfunctions.

Figure 11:
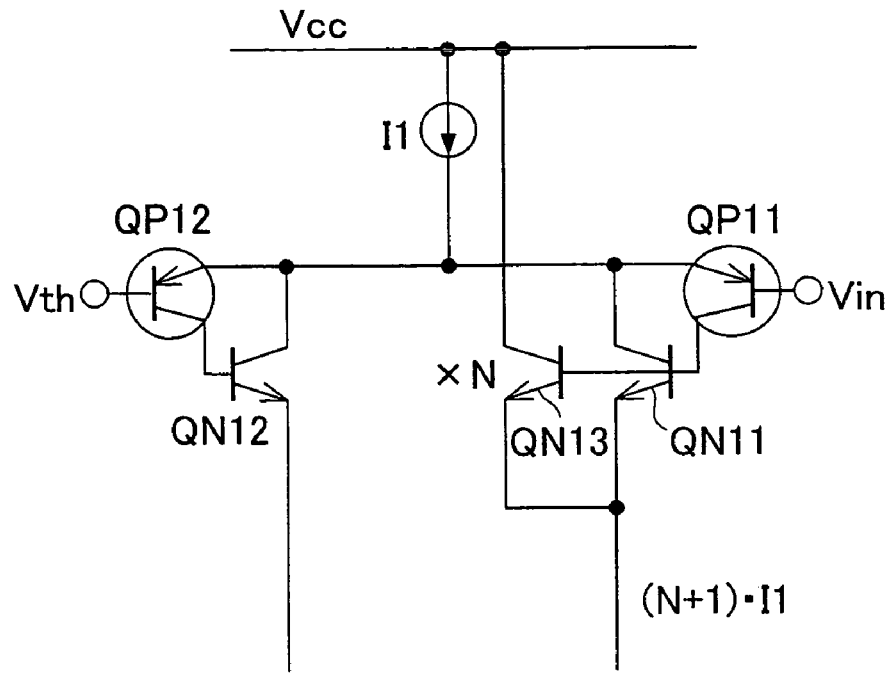
FIG. 11 is a circuit diagram illustrating an exemplary circuitry of a hysteresis comparator.

The following describes another exemplary circuitry. FIG. 11 illustrates a comparator circuit of the present embodiment, which has a VPNP structure of QP11 and QP12 in the circuitry of FIG. 5. The circuit of FIG. 11 operates in a manner similar to the circuit of FIG. 2.

Due to the VPNP structure, no light leak current occurs in QN11. An amount of light leak currents occurred at collectors of QN11 and QN13 does not affect R1. Thus, in the circuitry of the present embodiment, a light leak current is expressed by the following equation (17).

$$Ileak = 0 \quad (17)$$

This reduces occurrence of the light leak current, thereby reducing malfunctions.

Figure 12:
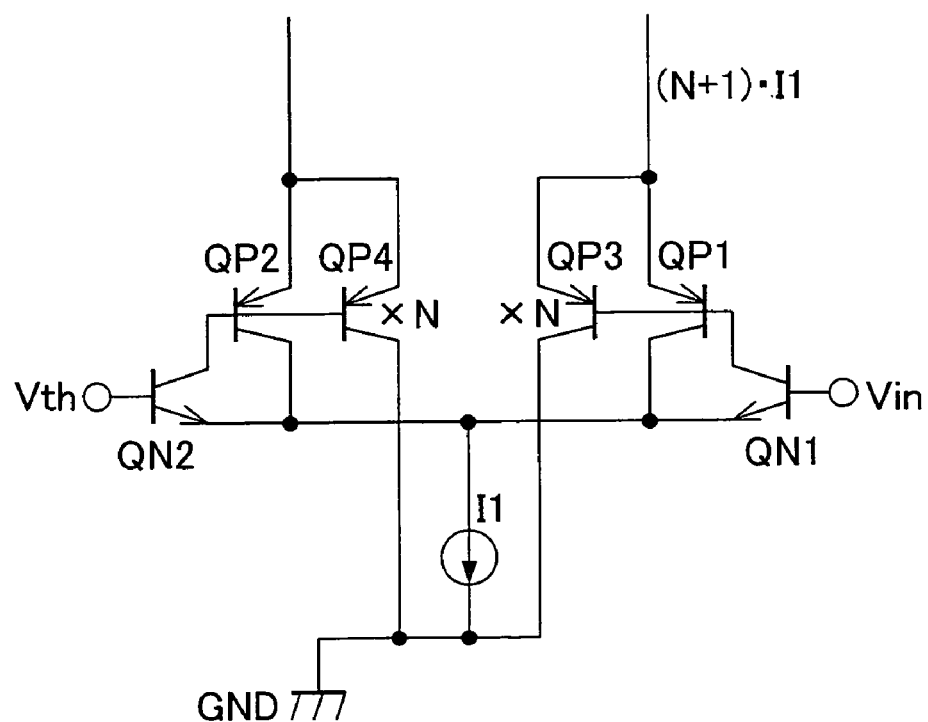
FIG. 12 is a circuit diagram illustrating an exemplary circuitry of a hysteresis comparator.

The following describes another embodiment of the circuitry. FIG. 12 illustrates a comparator circuit of the present embodiment. The circuit of FIG. 12 includes a fourth PNPTr, i.e., QP4, which is connected to QN2 so as to constitute a current mirror circuit. QN2 serving as a second PNPTr is provided on the opposite side of the differential pair in the circuit of FIG. 2. Further, the circuit of FIG. 12 is arranged such that the ratio of the current mirrored currents is equal.

In the circuit of FIG. 2, in each of the differential pairs, only one side, i.e., PNPTr, is multiplied by (N+1) times. Thus, an offset voltage Vos occurs in the differential pair QN1 and QN2, allowing the following relationship to be found.

$$Vbe = Vt \cdot \ln(Ic/Is),$$

where Vbe is a base-emitter voltage of a transistor, Vt=kt/q, k is Boltzmann constant, q is an elementary electric charge, T is an absolute temperature, Is is a saturation current of a transistor, and Ic is a collector current of a transistor. When Is and hfe(pnp) are respectively the same for the transistors, an offset voltage Vos occurs, which is expressed by the following equation (18).

$$Vos = Vbe(QN1) - Vbe(QN2) \quad (18)$$
$$= Vt \cdot \ln\{(N+1) \cdot I1/(hfe(pnp) \cdot Is)\} -$$
$$Vt \cdot \ln\{I1/(hfe(pnp) \cdot Is)\}$$
$$= Vt \cdot \ln(N+1)$$

On the other hand, in the circuit of FIG. 12, an offset Vos is expressed by the following equation (19).

$$Vos = Vbe(QN1) - Vbe(QN2) \quad (19)$$
$$= Vt \cdot \ln\{(N+1) \cdot I1/(hfe(pnp) \cdot Is)\} -$$
$$Vt \cdot \ln\{(N+1) \cdot I1/(hfe(pnp) \cdot Is)\}$$
$$= Vt \cdot \ln 1$$
$$= 0$$

When there is no mismatch in elements, ideally, no offset voltage occurs.

Figure 13:
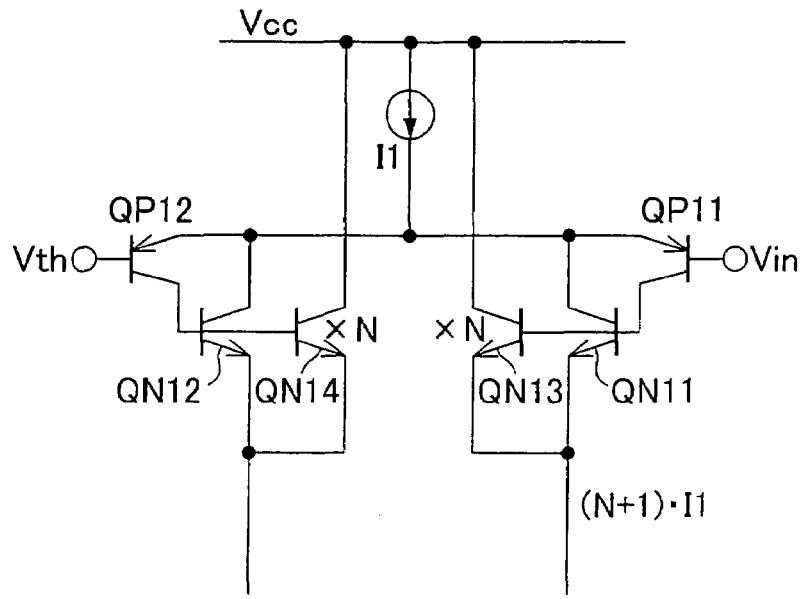
FIG. 13 is a circuit diagram illustrating an exemplary circuitry of a hysteresis comparator.

The following describes another exemplary circuitry. FIG. 13 illustrates a comparator circuit of the present embodiment. The circuit of FIG. 13 includes a fourth NPNTr, i.e., QN14, which is connected to QN12 so as to constitute a current mirror circuit. QN12 serving as a second NPNTr is provided on the opposite side of the differential pair in the circuit of FIG. 5. Further, the circuit of FIG. 13 is arranged such that the ratio of the current mirrored currents is equal.

An offset voltage Vos is expressed by the following equation (20). When there is no mismatch in elements, ideally, no offset voltage occurs.

$$Vos = Vbe(QP11) - Vbe(QP12) \quad (20)$$
$$= Vt \cdot \ln\{(N+1) \cdot I1/(hfe(npn) \cdot Is)\} -$$
$$Vt \cdot \ln\{(N+1) \cdot I1/(hfe(npn) \cdot Is)\}$$
$$= Vt \cdot \ln 1$$
$$= 0$$

Further, the comparator circuit of the present embodiment may be arranged such that the circuit goes into the standby mode (i) when an input voltage of not more than a threshold voltage Vth_H is inputted while the input voltage increases and (ii) when an input voltage of not more than a threshold voltage Vth_L is inputted while the input voltage is decreases, and the circuit goes into the normal mode (i) when an input voltage of more than the threshold voltage Vth_H is inputted while the input voltage increases and (ii) when an input voltage of more than the threshold voltage Vth_L is inputted while the input voltage decreases.

According to the arrangement, in addition to the effects achieved by the comparator circuit of the present embodiment, with a simple circuitry, it is possible to (i) reduce a current draw during standby, (ii) increase a drive current, and (iii) reduce effects of light leak current.

Further, the comparator circuit of the present embodiment may be arranged such that the circuit goes into the standby mode (i) when an input voltage of not less than the threshold voltage Vth_H is inputted while the input voltage increases and (ii) when an input voltage of not less than the threshold voltage Vth_L is inputted while the input voltage decreases, and the circuit goes into the normal mode (i) when an input voltage of less than the threshold voltage Vth_H is inputted while the input voltage increases and (ii) when an input voltage of less than the threshold value Vth_L is inputted while the input voltage decreases.

According to the arrangement, in addition to the effects achieved by the comparator circuit of the present embodiment, with a simple circuitry, it is possible to (i) reduce a current draw during standby, (ii) increase a drive current, and (iii) reduce effects of light leak current.

Further, the comparator circuit of the present embodiment may be arranged such that the amplifier circuit includes: a first differential pair of a first NPN transistor and a first PNP transistor, which receive the input voltage and have a darlignton connection with each other; a second differential pair of a second NPN transistor and a second PNP transistor, which receive a threshold voltage of the comparator circuit and have a darlignton connection with each other; and a third PNP transistor connected to the first PNP transistor so as to constitute a current mirror circuit.

According to the arrangement, in addition to the effects achieved by the comparator circuit of the present embodiment, with a simple circuitry, it is possible to (i) reduce a current draw during standby, (ii) increase a drive current, and (iii) reduce effects of light leak current.

Further, the comparator circuit of the present embodiment may be arranged such that the amplifier circuit further includes a fourth PNP transistor connected to the second PNP transistor of the second differential pair so as to constitute a current mirror circuit, and the fourth PNP transistor is arranged such that a ratio between a current mirrored current of the first differential pair and a current mirrored current of the second differential pair is equal.

According to the arrangement, in addition to the effects achieved by the comparator circuit of the present embodiment, reduction in offset voltage of the differential pairs is realized.

Further, the comparator circuit of the present embodiment may be arranged such that the amplifier circuit includes: a first differential pair of a first PNP transistor and a first NPN transistor, which receive an input voltage and have a darlignton connection with each other; a second differential pair of a second PNP transistor and a second NPN transistor, which receive a threshold voltage of the comparator circuit and have a darlignton connection with each other; and a third NPN transistor connected to the first NPN transistor so as to constitute a current mirror circuit.

According to the arrangement, in addition to the effects achieved by the comparator circuit of the present embodiment, with a simple circuitry, it is possible to (i) reduce a current draw during standby, (ii) increase a drive current, and (iii) reduce effects of light leak current.

Further, the comparator circuit of the present embodiment may be arranged such that the amplifier circuit further includes a fourth NPN transistor connected to the second NPN transistor of the second differential pair so as to constitute a current mirror circuit, and the fourth NPN transistor is arranged such that a ratio between a current mirrored current of the first differential pair and a current mirrored current of the second differential pair is equal.

According to the arrangement, in addition to the effects achieved by the comparator circuit of the present embodiment, reduction in offset voltage of the differential pairs is realized.

Further, in the comparator circuit of the present embodiment, the PNP transistor may have a vertical PNP structure.

According to the arrangement, the PNP transistor has a vertical PNP structure. Thus, in addition to the effects achieved by the comparator circuit of the present embodiment, effects of light leak current is reduced.

As described above, a comparator circuit of the present embodiment may be arranged such that a current buffer circuit is provided (connected) in its own current output stage. This realizes a reduction in the current draw during standby, an increase in the drive voltage, and reduced effects of light leak current.

Further, a comparator circuit of the present embodiment may be arranged such that its own input stage serves as a differential pair of an NPNTr and a PNPTr, which have a darlignton connection with each other. Further, the comparator may include a third PNPTr, which is connected to the first PNPTr so as to constitute a current mirror circuit. This realizes a reduction in the current draw during standby, an increase in the drive voltage, and reduced effects of light leak current.

Further, a fourth PNPTr may be provided which is connected to a second PNPTr so as to constitute a current mirror circuit. The second PNPTr is provided on the opposite side of the differential pair. Further, the fourth PNPTr may be arranged such that the ratio of the current mirrored currents is equal. This realizes reduction in offset voltage of the differential pairs.

Further, a comparator circuit of the present embodiment may be arranged such that its own input stage serves as a differential pair of a PNPTr and an NPNTr, which have a darlignton connection with each other. Further, the comparator circuit may include a third NPNTr, which is connected to the first NPNTr so as to constitute a current mirror circuit. This realizes a reduction in the current draw during standby, an increase in the drive voltage, and reduced effects of light leak current.

Further, a fourth NPNTr may be provided which is connected to a second NPNTr so as to constitute a current mirror circuit. The second NPNTr is provided on the opposite side of the differential pair. Further, the fourth NPNTr may be arranged such that the ratio of the current mirrored currents is equal. This realizes reduction in offset voltage of the differential pairs.

Further, a comparator circuit of the present embodiment may be arranged such that the ratio of the current mirrored currents is set to 1:N. This allows the effects to be multiplied by (N+1).

Further, a comparator circuit of the present embodiment may be arranged such that the PNP transistor may have a VPNPTr structure. This reduces effects of light leak current.

Further, a hysteresis comparator circuit of the present embodiment may include a comparator circuit, a current-to-voltage conversion resistor R, an output stage circuit, and a hysteresis voltage generating circuit. This realizes a hysteresis comparator circuit that is capable of (i) reducing a current draw during standby, (ii) increasing a drive voltage, and (iii) reducing effects of light leak current.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A comparator circuit, comprising:
   a comparator section for comparing an input voltage and a threshold voltage, and for outputting a current in accordance with a result of the comparison between the input voltage and the threshold voltage, the comparator section including a constant current source for outputting a first current; and
   an amplifier circuit for amplifying the first current, and for outputting the first current thus amplified as a second current,
   the comparator section outputting the current that is an addition of the first current and the second current when the input voltage is more than the threshold voltage, whereas the comparator section outputting no current when the threshold voltage is more than the input voltage, wherein
   the comparator section includes:
      a first differential pair of a first NPN transistor and a first PNP transistor, which receive the input voltage and have a Darlington connection with each other; and
      a second differential pair of a second NPN transistor and a second PNP transistor, which receive the threshold voltage and have a Darlington connection with each other, and
   the amplifier circuit includes a third PNP transistor whose base and emitter are connected with base and emitter, respectively, of the first PNP transistor.

2. The comparator circuit according to claim 1, wherein the amplifier circuit further includes a fourth PNP transistor whose base and emitter are connected with base and emitter, respectively, of the second PNP transistor of the second differential pair, and the fourth PNP transistor is arranged such that a ratio between a current of the first differential pair and a current of the second differential pair is equal.

3. The comparator circuit according to claim 1, wherein the PNP transistor has a vertical PNP structure.

4. The comparator circuit according to claim 2, wherein the PNP transistor has a vertical PNP structure.

5. A comparator circuit comprising:
   a comparator section for comparing an input voltage and a threshold voltage, and for outputting a current in accordance with a result of the comparison between the input voltage and the threshold voltage, the comparator section including a constant current source for outputting a first current; and
   an amplifier circuit for amplifying the first current, and for outputting the first current thus amplified as a second current,
   the comparator section outputting the current that is an addition of the first current and the second current when the input voltage is more than the threshold voltage, whereas the comparator section outputting no current when the threshold voltage is more than the input voltage, wherein
   the comparator section includes:
      a first differential pair of a first PNP transistor and a first NPN transistor, which receive the input voltage and have a Darlington connection with each other;
      a second differential pair of a second PNP transistor and a second NPN transistor, which receive the threshold voltage and have a Darlington connection with each other, and
   the amplifier circuit includes a third NPN transistor whose base and emitter are connected with base and emitter, respectively, of the first NPN transistor.

6. The comparator circuit according to claim 5, wherein the amplifier circuit further includes fourth NPN transistor whose base and emitter are connected with base and emitter, respectively, of the second NPN transistor of the second differential pair, and the fourth NPN transistor is arranged such that a ratio between a current of the first differential pair and a current of the second differential pair is equal.

7. The comparator circuit according to claim 5, wherein the PNP transistor has a vertical PNP structure.

8. The comparator circuit according to claim 6, wherein the PNP transistor has a vertical PMP structure.

9. An infrared remote control receiver comprising a comparator circuit,
   the comparator circuit including:
      a comparator section for comparing the input voltage and a threshold voltage, and for outputting a current in accordance with a result of comparison between the input voltage and the threshold voltage, the comparator section including a constant current source for outputting a first current; and
      an amplifier circuit for amplifying the first current, and for outputting the first current thus amplified as a second current,
      the comparator section outputting the current that is an addition of the first current and the second current when the input voltage is more than the threshold voltage, whereas the comparator section outputting no current when the threshold voltage is more than the input voltage, wherein
      the comparator section includes:
         a first differential pair of a first NPN transistor and a first PNP transistor, which receive the input voltage and have a Darlington connection with each other; and
         a second differential pair of a second NPN transistor and a second PNP transistor, which receive the threshold voltage and have a Darlington connection with each other, and
      the amplifier circuit includes a third PNP transistor whose base and emitter are connected with base and emitter respectively, of the first PNP transistor.

10. An infrared remote control receiver comprising a comparator circuit,
    the comparator circuit including;
       a comparator section for comparing an input voltage and a threshold voltage, and for outputting a current in accordance with a result of comparison between the input voltage and the threshold voltage, the comparator section including a constant current source for outputting a first current; and
       an amplifier circuit for amplifying the first current, and for outputting the first current thus amplified as a second current, the comparator section outputting the current that is an addition of the first current and the second current when the input voltage is more than the threshold voltage, whereas the comparator section outputting no current when the threshold voltage is more than the input voltage, the comparator section includes:

a first differential pair of a first PNP transistor and a first NPN transistor, which receive the input voltage and have a Darlington connection with each other; and a second differential pair of a second PNP transistor and a second NPN transistor, which receive the threshold voltage and have Darlington connection with each other, and the amplifier circuit includes a third NPN transistor whose base and emitter are connected with base and emitter, respectively, of the first NPN transistor.

* * * * *